(12) United States Patent
Ayraud et al.

(10) Patent No.: US 10,063,189 B2
(45) Date of Patent: Aug. 28, 2018

(54) METHOD AND DEVICE FOR SELF-BIASED AND SELF-REGULATED COMMON-MODE AMPLIFICATION

(71) Applicant: STMicroelectronics (Grenoble 2) SAS, Grenoble (FR)

(72) Inventors: Michel Ayraud, Voreppe (FR); Sandrine Nicolas, Saint Egreve (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/589,814

(22) Filed: May 8, 2017

(65) Prior Publication Data
US 2018/0152142 A1 May 31, 2018

(30) Foreign Application Priority Data
Nov. 29, 2016 (FR) ...................... 16 61640

(51) Int. Cl.
*H04B 1/40* (2015.01)
*H03F 1/02* (2006.01)
*H03F 3/193* (2006.01)
*H03F 1/22* (2006.01)

(52) U.S. Cl.
CPC .......... *H03F 1/0205* (2013.01); *H03F 1/223* (2013.01); *H03F 3/193* (2013.01); *H04B 1/40* (2013.01); *H03F 2200/129* (2013.01); *H03F 2200/451* (2013.01)

(58) Field of Classification Search
CPC ......... H03F 2203/45008; H03F 1/0205; H04B 1/40
See application file for complete search history.

(56) References Cited

U.S. PATENT DOCUMENTS

| 4,387,349 | A | 6/1983 | Rapp |
| 4,591,800 | A | 5/1986 | Opas |
| 5,568,093 | A | 10/1996 | Holzer |
| 5,686,821 | A | 11/1997 | Brokaw |
| 5,815,012 | A | 9/1998 | Rivoir et al. |
| 6,023,196 | A * | 2/2000 | Ashby ................. H03D 7/1433 330/259 |
| 6,255,889 | B1 * | 7/2001 | Branson ................ G06G 7/163 327/359 |
| 6,369,712 | B2 | 4/2002 | Letkomiller et al. |
| 6,437,612 | B1 * | 8/2002 | Dasgupta ............... H03F 1/301 327/108 |
| 6,448,839 | B1 * | 9/2002 | Tomasini ............... H03F 1/301 327/362 |
| 6,507,178 | B2 | 1/2003 | Cocetta et al. |
| 7,358,807 | B2 | 4/2008 | Scuderi et al. |

(Continued)

FOREIGN PATENT DOCUMENTS

WO 2014080668 A1 5/2014

*Primary Examiner* — Cindy Trandai
(74) *Attorney, Agent, or Firm* — Slater Matsil, LLP

(57) ABSTRACT

An amplification device includes an amplification stage having a transconductance amplification transistor and an output terminal. A biasing circuit is configured to bias in common mode the output terminal to a bias potential obtained on the basis of a voltage present between the gate and the source of the amplification transistor, and to compensate for parasitic variations of the voltage present between the gate and the source of the amplification transistor.

19 Claims, 6 Drawing Sheets

(56) References Cited

U.S. PATENT DOCUMENTS

| | | |
|---|---|---|
| 7,855,603 B1 | 12/2010 | Thor |
| 9,479,208 B2 | 10/2016 | Papotto et al. |
| 2002/0109491 A1* | 8/2002 | Kussener ............... G05F 3/30 |
| | | 323/313 |
| 2002/0186586 A1* | 12/2002 | Conte ............... G11C 16/24 |
| | | 365/185.2 |
| 2005/0052209 A1* | 3/2005 | Jacobs ............... H03F 1/305 |
| | | 327/170 |
| 2005/0266823 A1 | 12/2005 | Cathelin et al. |
| 2006/0125463 A1* | 6/2006 | Yen ............... G05F 3/262 |
| | | 323/316 |
| 2007/0076890 A1* | 4/2007 | Muresan ............... H04L 9/003 |
| | | 380/287 |
| 2007/0171685 A1* | 7/2007 | Yang ............... H02M 3/33507 |
| | | 363/21.12 |
| 2008/0048763 A1* | 2/2008 | Kawano ............... G01J 5/22 |
| | | 327/535 |
| 2009/0303094 A1* | 12/2009 | Pun ............... H03F 3/45071 |
| | | 341/144 |
| 2010/0159853 A1* | 6/2010 | Guerra ............... H03F 3/3022 |
| | | 455/95 |
| 2012/0182072 A1 | 7/2012 | Park et al. |
| 2013/0249527 A1* | 9/2013 | Arnold ............... G05F 3/30 |
| | | 323/314 |
| 2014/0077789 A1* | 3/2014 | Hu ............... G05F 3/30 |
| | | 323/313 |
| 2014/0253057 A1* | 9/2014 | Guhados ............... G05F 1/625 |
| | | 323/268 |
| 2016/0276991 A1* | 9/2016 | Lin ............... H03F 1/0205 |

* cited by examiner

METHOD AND DEVICE FOR SELF-BIASED AND SELF-REGULATED COMMON-MODE AMPLIFICATION

CROSS-REFERENCE TO RELATED APPLICATIONS

This application claims priority to French Patent Application No. 1661640, filed on Nov. 29, 2016, which application is hereby incorporated herein by reference.

TECHNICAL FIELD

Embodiments and modes of implementation relate to a method and device for self-biased and self-regulated common-mode amplification.

BACKGROUND

Figure 1:
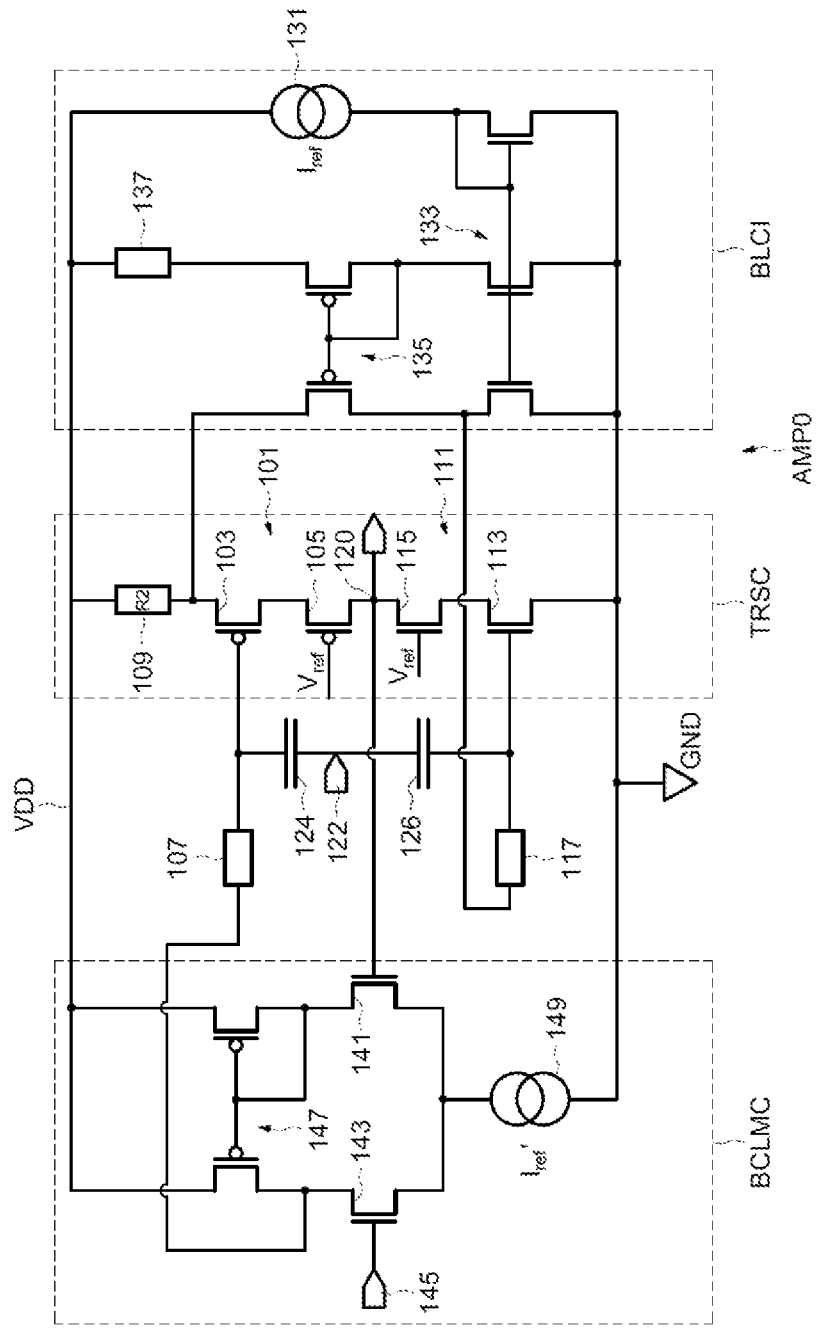

FIG. 1 represents an exemplary conventional amplifier AMPo of a radio frequency reception chain.

An input terminal 122 receives a voltage radio frequency signal, amplified by a transconductance amplification stage TRSC comprising two cascoded amplification arrangements 101, 111 and whose current output 120 exhibits a controlled common mode, so as, for example, to facilitate its interfacing with other blocks.

The first cascoded amplification arrangement 101 comprises a transconductance amplification transistor 103 of P-MOS type whose gate is coupled to the input terminal 122, in series with a cascode transistor 105 of P-MOS type whose drain is connected to the output 120.

The second cascoded amplification arrangement 111 comprises a transconductance amplification transistor 113 of N-MOS type whose gate is coupled to the input terminal 122, in series with a cascode transistor 115 of N-MOS type whose drain is connected to the output 120.

A resistor 109 (of value R2) connected between a supply voltage terminal VDD and the amplification transistor 103 makes it possible to perform the measurement of the static current which passes through the cascoded amplification arrangements 101, 111 of the transconductance amplification stage TRSC, and flows towards a terminal intended to be connected to a reference voltage GND, for example, the ground.

Such controlled common-mode configurations are employed notably within the framework of the reception of radio frequency signals, in particular with low energy consumption, because of constraints in respect of low noise and of high operating frequencies.

However, the biasing of the common output terminal 120 is not controllable in such a cascoded amplification stage TRSC alone.

Closed-loop feedback control systems (BCLI, BCLMC) have been produced, the first controlling the flow of the static current in both of the cascoded amplification arrangements 101, 111, the second so as to control the common-mode bias potential of the output terminal 120.

A closed-loop current feedback control BCLI comprises in this representation a reference current Iref generator 131, a first current mirror arrangement 133 and a second current mirror arrangement 135.

The current-feedback-control loop BCLI makes it possible to compare the voltage across the terminals of the resistor 109, representative of the static current flowing in the cascoded amplification stage TRSC, with a reference voltage generated by the flow of the reference current I in a resistor 137.

A lack or an excess of static current will be compensated by respectively an increase or a decrease of the voltage controlling the amplification transistor 113 by way of a resistor 117.

Moreover, closed-loop feedback control of the biasing of the common mode BCLMC, makes it possible to compensate a drop or a rise of the bias voltage of the output 120.

The common-mode feedback control loop BCLMC comprises a probing transistor 141 controlled by the potential present on the common output 120, a transistor 143 controlled by a fixed reference voltage present on a reference voltage terminal 145, each being connected on the one hand to the supply voltage terminal VDD and on the other hand to the reference voltage terminal GND by way of a current generator 149 drawing a current Iref in the sources of the transistors 141 and 143.

A current mirror arrangement 147 makes it possible to produce the difference of the currents passing through the transistors 141 and 143 and to compensate a drop or a rise in the bias of the output 120 by lowering or by increasing the voltage controlling the P-MOS transistor 103, by way of a resistor 107.

Consequently, the feedback control of one loop (BCLMC or BCLI) acts strongly on the reaction of the other loop (BCLI or BCLMC). This interaction of one loop on the other can be controlled in terms of stability of a feedback-controlled system only if one of the 2 loops exhibits a very low cutoff frequency with respect to the other.

The necessity for one of the 2 loops to be very slow introduces a long and very undesirable overall response time of the amplifier AMPo.

Figure 2:
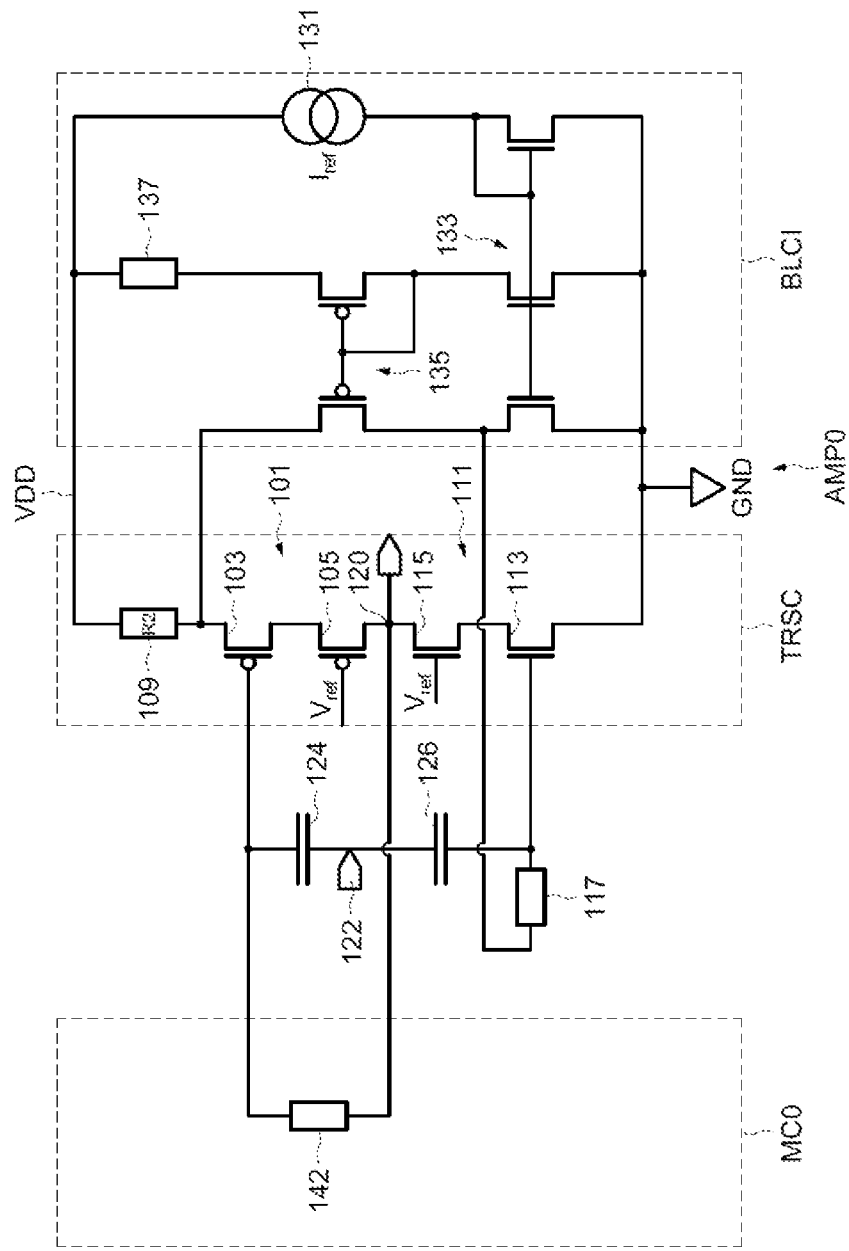

FIG. 2 represents a prior art solution in which the closed-loop feedback control of the biasing of the common mode BCLMC is replaced with a self-biasing circuit MCo for the common mode.

The self-biasing circuit MCo comprises a resistor 142 connected between the gate of the amplification transistor 103 and the output terminal 120.

The resistor 142 has a high value so as to minimize the losses in the output current and the losses in terms of gain of the amplification stage TRSC.

The bias of the output terminal is applied notably on the basis of the voltage present between the source and the gate of the amplification transistor 103.

This solution exhibits the drawback of being very unstable in relation to temperature variations (the gate-source voltage of the amplification transistor possibly varying by 2 mV/° C.) and of being unstable because of the variations of the characteristics of the amplification transistor 103 from one fabrication batch to another.

The bias voltage thus undergoes detrimental variations due to parasitic and uncontrollable variations of the voltage present between the gate and the source of the amplification transistor.

This is why according to embodiments an amplification device comprises a cascoded amplification stage, a current feedback control closed loop and a common-mode biasing open loop, the common mode being self-biased and furthermore self-regulated in relation to parasitic variations, by means of the open loop.

By cascoded amplification arrangement is meant an arrangement comprising a transconductance amplification transistor and a so-called cascode transistor in series. The role of the cascode transistor is, for example, to afford good input-output isolation, a high output impedance, a gain or a greater bandwidth.

SUMMARY

Embodiments and modes of implementation of the present invention relate to the amplification of signals, e.g., radio frequency signals, and, in particular embodiments, to the amplification of a signal received in a reception stage of a radio frequency communication chain.

According to one aspect, there is proposed a method of common-mode biasing of an output terminal of an amplification stage comprising a transconductance amplification transistor. The method includes biasing the output terminal to a bias potential obtained on the basis of a gate-source voltage present between the gate and the source of the amplification transistor, as well as a compensation of parasitic variations of the gate-source voltage.

By parasitic variations is meant notably the variations in the behavior of the amplification transistor as a function of temperature, or else the variations between two technological embodiments of the components of the amplification stage due to random uncertainties in the method of fabrication.

An implementation of the method according to this aspect makes it possible notably to bias the common mode by applying a bias voltage directly to the output terminal, without calling upon a modification of the static current flowing in the amplification stage. The implementation of the compensation of the parasitic variations makes it possible to benefit from the advantages of regulation without undergoing the previously mentioned problems of feedback control loops.

According to one mode of implementation, the compensation comprises the passage of a compensation current through a first resistor connected between the gate of the amplification transistor and the output terminal, the compensation current generating a compensation voltage across the terminals of the first resistor which compensates the parasitic variations.

According to one mode of implementation, the amplification stage comprising a first cascoded amplification arrangement comprising the amplification transistor and a second cascoded amplification arrangement in series and sharing the output terminal with a controlled common mode, the second cascoded amplification arrangement having transistors of the opposite conductivity type to the conductivity type of the transistors of the first cascoded amplification arrangement, the method furthermore comprises regulation of the static current flowing in these two cascoded amplifiers.

According to another aspect, there is proposed an amplification device comprising an amplification stage having a transconductance amplification transistor and an output terminal. The amplification device comprises a biasing circuit configured to bias in common mode the output terminal to a bias potential obtained on the basis of a gate-source voltage present between the gate and the source of the amplification transistor. The biasing circuit is also configured to compensate parasitic variations of the gate-source voltage.

Thus, the bias of the common mode is applied directly to the output terminal, without calling upon a modification of the static current flowing in the cascoded amplification arrangements. The compensation of the parasitic variations in such a self-biased device makes it possible to benefit from the advantages of regulation without undergoing the previously mentioned problems of feedback control loops.

According to one embodiment, the biasing circuit is configured to pass a compensation current through a first resistor connected between the gate of the amplification transistor and the output terminal, the voltage generated across the terminals of the first resistor being intended to compensate the parasitic variations.

The biasing circuit advantageously comprises a compensation transistor paired with the amplification transistor, that is to say having the same characteristics, to within a size factor, as those of the amplification transistor, whose gate is linked to a terminal intended to receive a fixed control voltage, and being configured to generate the compensation current on its drain.

Thus, the compensation transistor having the same characteristics, to within a size factor, as the amplification transistor, random parasitic variations such as variations due to temperature have the same impact on both of the paired transistors, and are thus automatically compensated.

With an appropriate adjustment of the size factor, it is possible to find a compromise in which the gate-source voltage of the compensation transistor makes it possible to correct the variations of the gate-source voltage of the amplification transistor and of the static current passing through the cascoded amplification arrangement.

According to one embodiment, the biasing circuit comprises a second resistor connected between the source of the compensation transistor and the source of the amplification transistor.

The second resistor is advantageously used as a current generator in collaboration with the compensation transistor, on the basis of notably the voltage present on the source of the amplification transistor of the first cascoded amplifier arrangement.

According to one embodiment, the amplification stage comprises a third resistor connected between a supply terminal intended to receive a supply voltage and the source of the amplification transistor.

According to one embodiment, the biasing circuit comprises a current generator connected between the drain of the compensation transistor and a terminal intended to receive a reference voltage, and is configured to subtract an adjustment current from the compensation current.

This adjustment current generator offers an additional degree of freedom in the embodiment and the implementation of the biasing circuit, notably in the adjustment of the bias voltage of the output terminal with a controlled common mode. This generator makes it possible notably to produce the compensation transistor according to larger dimensions, so that it is more precise, without however passing a bigger compensation current through the first resistor and through the cascoded amplification arrangement.

Moreover, this generator can make it possible to reverse the direction of the current flowing in the first resistor and thus to introduce a compensation voltage of opposite sign across the terminals of the first resistor.

According to one embodiment, the amplification stage comprises a first cascoded amplification arrangement comprising the amplification transistor and a second cascoded amplification arrangement sharing the output terminal with a controlled common mode, the second cascoded amplification arrangement having transistors of the opposite conductivity type to the conductivity type of the transistors of the first cascoded amplification arrangement.

This embodiment is notably advantageous within the framework of radio frequency transmissions and notably with low energy consumption, such as, for example, transmissions of the Bluetooth Low Energy (BLE) type.

According to one embodiment, the device furthermore comprises a current-feedback-control loop configured to regulate a current flowing in the cascoded amplifier arrangements.

For example, the static-current-feedback-control loop can make it possible to have in the cascoded amplifier arrangements a current proportional to a reference current.

This current-feedback-control loop can be of conventional design, for example, of the type described previously in conjunction with FIG. 1, since in fact, the biasing circuit does not in any way influence such static-current closed-loop feedback control.

There is also proposed a radio frequency communication system comprising a reception stage connected to an antenna, the reception stage comprising at least one amplification device such as defined hereinabove and configured to amplify a reception signal, and signal processor configured to process the amplified signal.

According to another aspect there is proposed an electronic apparatus, such as a personal computer or a mobile telephone, advantageously comprising such a radio frequency communication system.

BRIEF DESCRIPTION OF THE DRAWINGS other advantages and characteristics of the invention will become apparent on examining the detailed description of wholly non-limiting embodiments and appended drawings in which:

FIGS. 1 and 2, previously described, represent examples of radio frequency amplifiers of the prior art;

FIGS. 3 to 7 represent various embodiments and modes of implementation of the invention.

DETAILED DESCRIPTION OF ILLUSTRATIVE EMBODIMENTS

Figure 3:
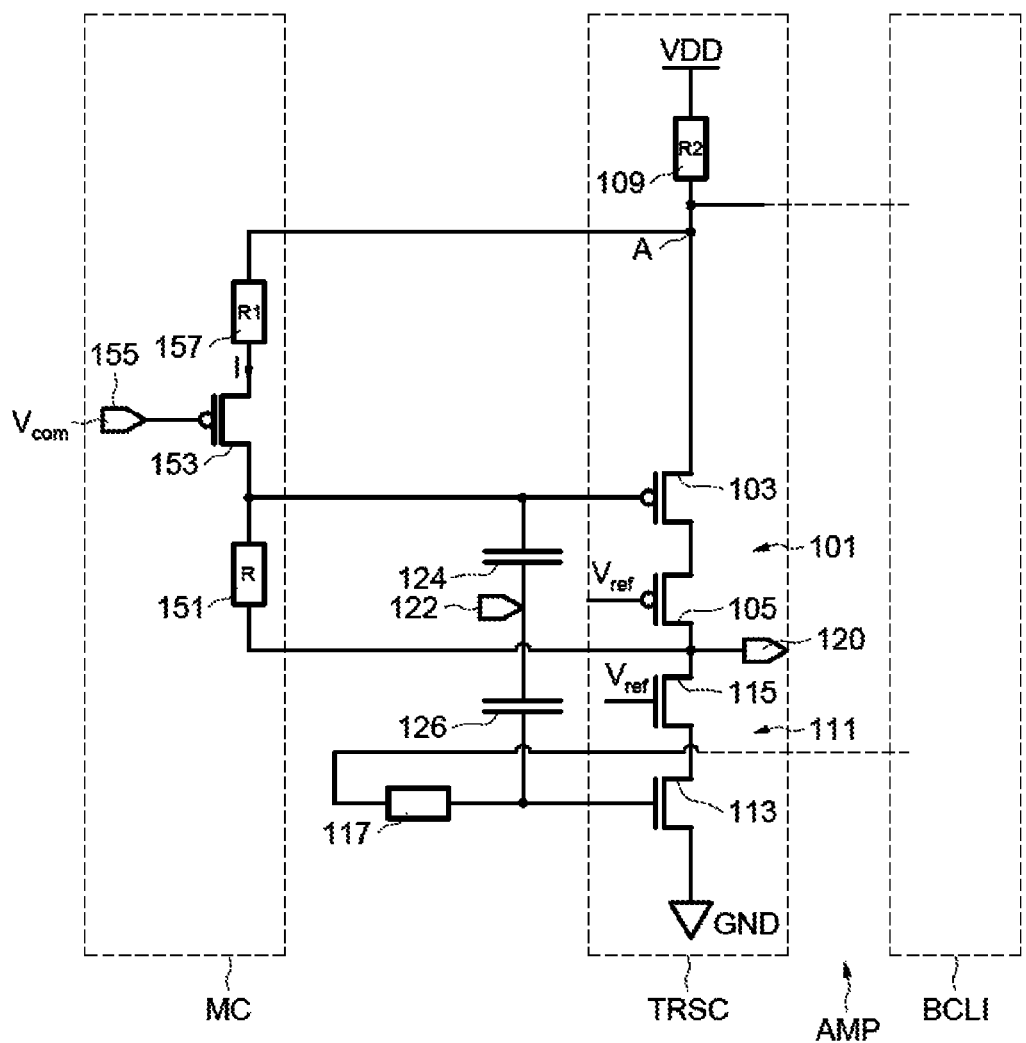

FIG. 3 represents an exemplary amplification device AMP comprising a first cascoded amplification arrangement 101 and a common-mode biasing open loop MC, otherwise called a "biasing circuit."

In this example, the first cascoded amplification arrangement 101 is included in a radio frequency signal transconductance amplification stage TRSC.

The amplification stage TRSC furthermore comprises a second cascoded amplification arrangement 111 connected by the output 120 to the first cascoded amplification arrangement 101.

The second cascoded amplification arrangement 111 comprises a transconductance amplification transistor of N-MOS type 113 and a cascode transistor of N-MOS type 115 connected in series between the output terminal 120 and a terminal intended to receive a reference voltage GND, for example, the ground.

The amplification device AMP also comprises a static-current feedback control closed loop BCLI, which can be of similar structure to that described in conjunction with FIG. 1 and is not represented nor described again here and hereinafter.

The first cascoded amplification arrangement 101 comprises a transconductance amplification transistor 103 of P-MOS type and a cascode transistor 105 of P-MOS type.

The amplification transistor 103 is connected on its source to a supply terminal intended to receive a supply voltage VDD by way of a resistor 109, and on its drain to the source of the cascode transistor 105 whose drain is connected to the output terminal 120.

The amplification transistor 103 is controlled on its gate by an input signal carried by the voltage present on an input terminal 122 and its function is to amplify this input signal in terms of dynamic current on the output terminal 120.

The gate of the amplification transistor 103 is coupled to the input terminal 122 by way of a capacitor 124 configured to behave as a short-circuit at the operating frequencies of the cascoded amplification arrangements 101 and 111, i.e., the frequencies of the signals received on the input terminal 122, and as a circuit breaker at the operating frequency of the common-mode biasing open loop MC.

Likewise, the gate of the amplification transistor 113 is coupled to the input terminal 122 by way of a capacitor 126 configured to behave as a short-circuit at the operating frequencies of the cascoded amplification arrangements 101 and 111, i.e. the frequencies of the signals received on the input terminal 122, and as a circuit breaker at the operating frequency of the static-current feedback control closed loop BCLI.

Cascode reference voltages Vref are applied to the gates of the cascode transistors 105 and 115 in a conventional manner known per se.

The transconductance amplification stage TRSC comprises a resistor 109 (of value R2), connected between a supply voltage terminal VDD and the amplification transistor 103, making it possible to perform the measurement of the static current which passes through the cascoded amplification arrangements 101, 111, and to control it by feedback with respect to a desired current, proportional to Iref (131) by means, for example, of a current-feedback-control loop BLCI.

The common-mode biasing circuit MC comprises a biasing circuit comprising a first resistor 151 (of value R). A first terminal of the first resistor 151 is connected to the gate of the amplification transistor 103 and the other terminal of the first resistor 151 is connected to the output terminal 120.

The common-mode biasing circuit MC furthermore comprises a compensation transistor 153, of P-MOS type, whose drain is connected to the first terminal of the resistor 151 (and therefore also to the gate of the amplification transistor 103). The compensation transistor 153 is connected on its gate to a control terminal 155 intended to receive a constant control voltage (Vcom).

The biasing circuit MC also comprises a resistor 157 (of value R1), connected on the one hand to the source of the compensation transistor 153 and on the other hand to a node A situated between the resistor 109 and the source of the amplification transistor 103.

The resistor 157 and the compensation transistor 153 together form a compensation current source I.

The compensation transistor 153 and amplification transistor 103 are paired, that is to say that they are produced in the course of the same fabrication method, so as to have the same characteristics, to within a size factor.

More precisely, the compensation transistor 153 and amplification transistor 103 have notably the same characteristic constant kp, the same threshold voltage Vth, an active region of one and the same length L, but of a different width W. This difference of width W influences the resistivity of the transistor and consequently the quantity of current passing between its conduction terminals.

The above-mentioned size factor is equal to the ratio of the widths of the active regions of the two transistors.

The variation of the width W is customarily obtained by producing a plurality of unitary transistors having strictly the same characteristics, linked in parallel. The size factor is thus equal to the number of unitary transistors connected in parallel.

In particular, the paired compensation transistor 153 and amplification transistor 103 manifest the same parasitic variations notably due to temperature.

Figure 4:
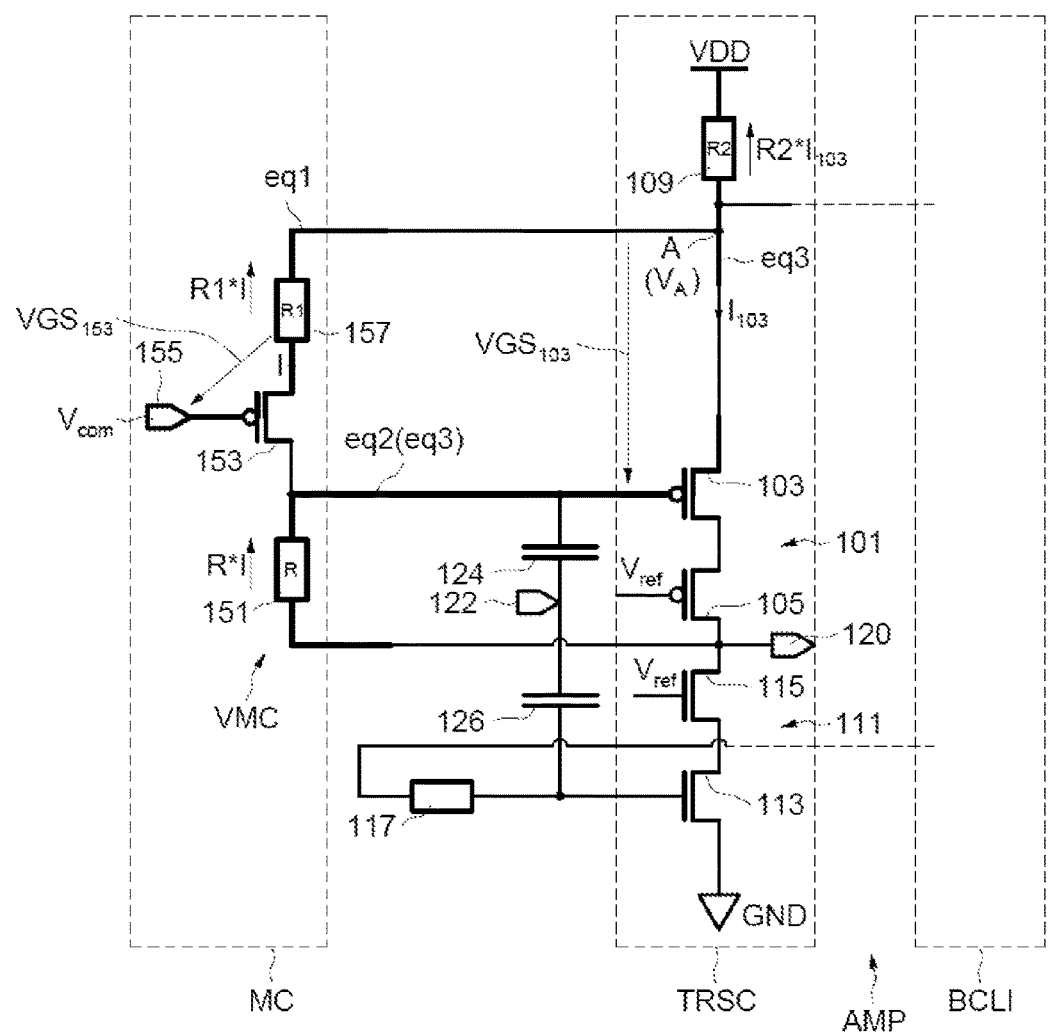

FIG. 4 represents the amplification device AMP described in conjunction with FIG. 3 in the operating state, and illustrates voltages and currents involved during implementation of the device AMP.

During operation, the resistor 109 controls the static current $I_{103}$ through the amplification stage TRSC, which adds thereto the input-signal variations amplified in terms of current.

The voltage $V_A$ of the node A can be expressed, by way of the compensation transistor 153, $$V_A = V\text{com} - VGS_{153} + R1*I \quad [\text{eq1}],$$

with I the compensation current in the resistor 157, in the conduction terminals of the compensation transistor 153 and in the resistor 151, and with $VGS_{153}$ the voltage present between the gate and the source of the compensation transistor 153.

The reference eq1 designates the "path traversed" to define equation [eq1], represented in bold in FIG. 4.

The bias voltage $V_{MC}$ of the output terminal can be expressed, with $VGS_{103}$ the voltage present between the gate and the source of the amplification transistor 103, by the following equation ([eq2]):

$$V_{MC} = V_A + VGS_{103} - R*I, \text{i.e., by inserting [eq1]},$$

$$V_{MC} = V\text{com} - VGS_{153} + R1*I + VGS_{103} - R*I, \text{i.e.}$$

$$V_{MC} = V\text{com} - VGS_{153} + VGS_{103} + I*(R1-R) \quad [\text{eq2}]$$

Likewise, the reference eq2 designates the path traversed to define equation [eq2], represented in bold in FIG. 4.

Moreover, with the acceptable approximation that $I_{103} \gg I$, $I_{103}$ representing the current passing through the amplification transistor 103, $$V_{MC} = VDD - R2*I_{103} + VGS_{103} - R*I \quad [\text{eq3}]$$

Likewise, the references eq3 designate the path traversed to define equation [eq3], represented in bold in FIG. 4.

Through $V_{MC} = [\text{eq2}]*R/R1 + [\text{eq3}]*(R1-R)/R1$, we obtain:

$$V_{MC} = VDD*(R1-R)/R1 + V\text{com}*R/R1 - I_{103}*R2*(R1-R)/R1 + VGS_{103} - VGS_{153}*R/R1 \quad [\text{eq4}]$$

If the areas of the transistors 153 and 103 are in the same ratio as the ratio of the currents passing through them, then $VGS_{153} = VGS_{103}$ and if we take R=R1, the equation simplifies thus: $V_{MC} = V\text{com}$.

Equation [eq4] shows that with an appropriate adjustment of the form factor of the compensation transistor 153, the variations of the value $VGS_{153}$ can compensate the variations of $VGS_{103}$ on the biasing of the output terminal 120.

For example, the width of the compensation transistor 153 can be 8 times smaller than the width of the amplification transistor 103.

Thus, the biasing of the common mode is applied directly on the output terminal, without calling upon a modification of the static current flowing in the cascoded amplification arrangements that might disturb the feedback control of this current by the feedback control closed loop BCLI.

Furthermore, the compensation transistor 153 and amplification transistor 103 being paired, random variations such as variations due to temperature are self-regulated.

In other words, a biasing of the output terminal 120 to a bias potential $V_{MC}$ obtained on the basis of the gate-source voltage $VGS_{103}$ present between the gate and the source of the amplification transistor 103 has been implemented. This biasing is furthermore self-regulated, that is to say that parasitic variations present between the gate and the source of the amplification transistor 103 are compensated by the same parasitic variations present on the compensation transistor 153.

More precisely, the compensation is implemented notably by virtue of the flow of the compensation current I in the first resistor 151, and generating a voltage R*I across its terminals comprising variations which compensate the parasitic variations of the voltage $VGS_{103}$.

This implementation of a biasing of the output terminal does not disturb the static current in the transconductance amplification stage TRSC, thus it is thus advantageously possible to effectively combine a closed-loop feedback control of the static current in a customary manner, for example, such as described in conjunction with FIG. 1, with this method for biasing the output terminal.

Figure 5:
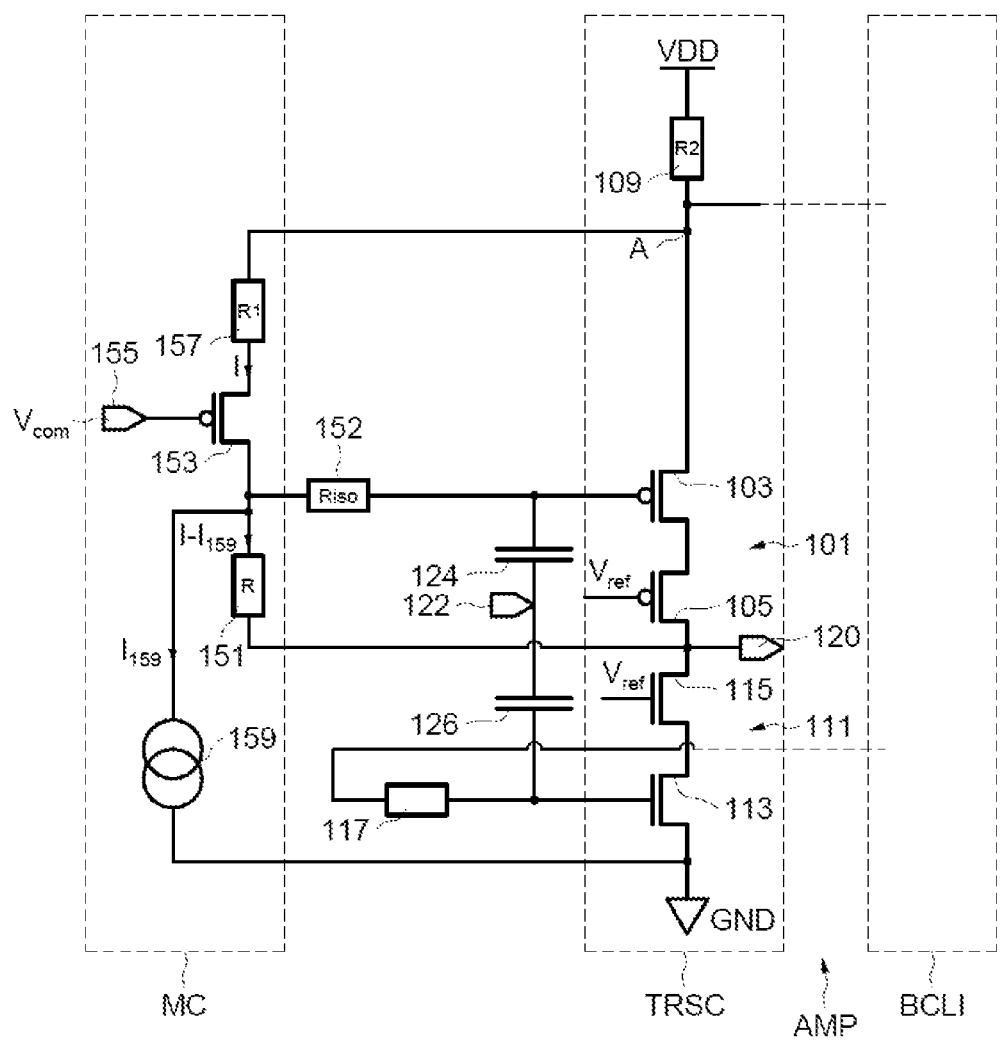

FIG. 5 represents another advantageous embodiment of the amplification device AMP. The elements common to this embodiment and to that described in conjunction with FIG. 3 bear the same references and are not detailed again here.

In this embodiment, the common-mode biasing open loop MC furthermore comprises a current generator 159 drawing a current $I_{159}$ on a node situated between the drain of the compensation transistor 153 and the first resistor 151 (that is to say on the node to which the gate of the amplification transistor 103 is also connected).

This makes it possible to pass a larger current I through the compensation transistor 153, without increasing the compensation current ($I-I_{159}$) passing through the first resistor 151, and therefore without increasing the compensation voltage across its terminals.

Thus, in this embodiment it is possible to employ a bigger compensation transistor (therefore exhibiting less dispersed characteristics), passing a larger and more precise current than when the size factor has to be fixed in order to balance equation eq3.

Moreover, this generator 159 can make it possible to reverse the direction of the current flowing in the first resistor 151 and thus to introduce a compensation voltage of opposite sign across the terminals of the first resistor 151.

Indeed, by adding the current source 159, the size of the transistor 153 can be increased so as to improve the precision of the common-mode voltage on the output 120. On the other hand, increasing the size of the transistor 153 increases its parasitic output capacitance, and as a consequence the capacitance on the input 122 of the amplifier TRSC.

Thus, an isolation resistor 152 is connected between the source of the compensation transistor 153 and the gate of the amplification transistor 103. The isolation resistor 152 exhibits a large resistive value so as to mask the parasitic capacitance which exists on the drain of the transistor 153.

Adding the isolation resistor 152 makes it possible to isolate the input 122 in relation to the output capacitance of the transistor 153. This resistor being not traversed by any static current (since it is connected to the gate of the transistor 103), no voltage drop occurs across its terminals: it does not therefore play any role in equation [eq4]. Its value can be chosen arbitrarily, and preferably so as to be much greater (for example, by an order of magnitude) than the output impedance of the transistor 153, at the working frequency.

Figure 6:
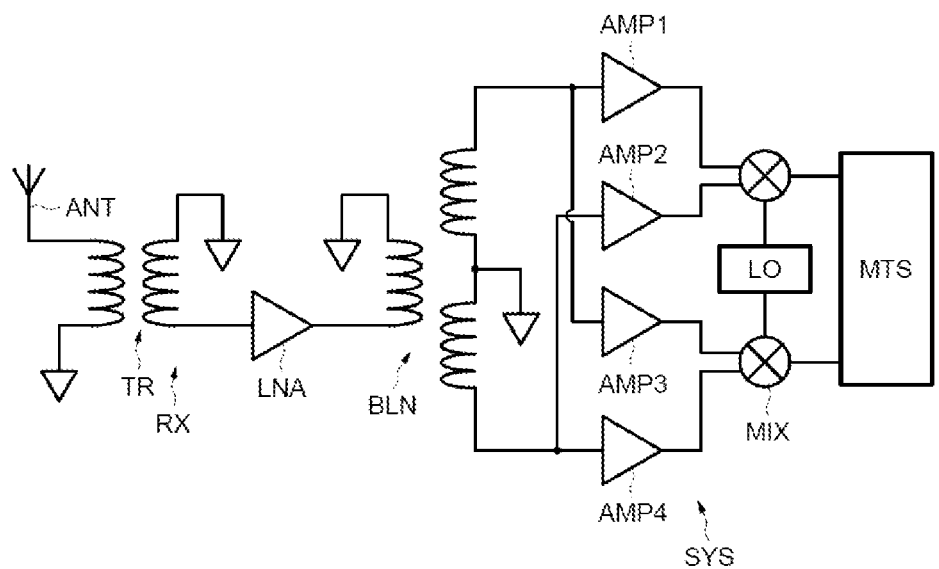

FIG. 6 represents an exemplary radio frequency communication system SYS, comprising an antenna ANT and a reception stage RX connected to the antenna by way of a transformer TR.

The reception stage RX conventionally comprises a low noise amplifier LNA, transmitting the signal received by the antenna ANT to a symmetric-asymmetric transformer BLN ("balun" according to the usual term).

On output from the balun transformer BLN, the signal is in differential mode, and each differential circuit comprises an amplification device AMP1, AMP2, AMP3, AMP4 of the type of the devices described in conjunction with FIGS. 3 to 5.

The reception stage RX is thus configured to amplify a reception signal by means of the amplification devices AMP1, AMP2, AMP3, AMP4, having a controlled common output mode.

Mixers MIX carry out a frequency transposition with a signal generated by a local oscillator LO, before processing by radio frequency signal processor MTS, for example, implemented digitally.

Figure 7:
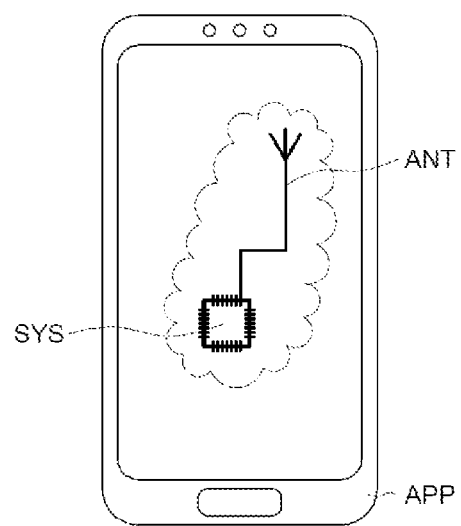

FIG. 7 represents an exemplary electronic apparatus APP equipped with an embodiment of a radio frequency communication system SYS such as detailed previously, here a mobile telephone. It will be apparent to the person skilled in the art that the embodiments of a radio frequency communication system SYS or of an amplification device AMP such as detailed previously can be included with any other type of apparatus or other known system not described here.

Moreover, the invention is not limited to the embodiments which have been described hereinabove but embraces all variants thereof, for example, the static-current feedback control loop described previously has been given by way of example, as has the cascode amplification arrangement or the radio frequency system.

What is claimed is:

1. A method of common-mode biasing of an output terminal of an amplification stage that comprises a Iran conductance amplification transistor, the method comprising: biasing the output terminal to a bias potential that is based on a gate-source voltage present between a gate and a source of the amplification transistor and on a compensation of parasitic variations of the gate-source voltage, wherein the compensation is based on a compensation current flowing in a resistor connected between the gate of the amplification transistor and the output terminal, the compensation current generating a compensation voltage across terminals of the resistor.

2. The method according to claim 1, wherein the amplification stage comprises a first cascoded amplification arrangement that comprises the amplification transistor and a second cascoded amplification arrangement in series and sharing the output terminal with a controlled common mode, the second cascaded amplification arrangement having transistors of a conductivity type opposite to a conductivity type of transistors of the first cascoded amplification arrangement, the method further comprising regulating a static current flowing in the first and second cascoded amplification arrangements.

3. An amplification device comprising: an amplification stage having a transconductance amplification transistor and an output terminal; and a biasing circuit configured to bias, in common mode, the output terminal to a bias potential based on a gate-source voltage present between a gate and a source of the amplification transistor, the gate-source voltage being compensated for parasitic variations, wherein the biasing circuit is configured to pass a compensation current through a first resistor connected between the gate of the amplification transistor and the output terminal, a voltage generated across terminals of the first resistor being intended to compensate the parasitic variations.

4. The device according to claim 3, wherein the biasing circuit comprises a compensation transistor paired with the amplification transistor of the compensation transistor being connected to a terminal intended to receive a fixed control voltage, and being configured to generate the compensation current at a drain thereof.

5. The device according to claim 4, wherein the biasing circuit comprises a second resistor connected between a source of the compensation transistor and the source of the amplification transistor.

6. The device according to claim 5, wherein the amplification stage comprises a third resistor connected between a supply terminal intended to receive a supply voltage and the source of the amplification transistor.

7. The device according to claim 4, wherein the biasing circuit comprises a current generator connected between the drain of the compensation transistor and a terminal intended to receive a reference voltage, the current generator configured to subtract an adjustment current from the compensation current.

8. The device according to claim 3, wherein the amplification stage comprises a resistor connected between a supply terminal intended to receive a supply voltage and the source of the amplification transistor.

9. The device according to claim 3, wherein the amplification stale comprises a first input on the gate of the amplification transistor and coupled to an input terminal by a filtering capacitor that is configured to behave as a short-circuit at an operating frequency of the amplification stage and as a circuit breaker at an operating frequency of the biasing circuit.

10. The device according to claim 9, further comprising a current-feedback-control loop configured to regulate a current flowing in the amplification stage.

11. A radio frequency communication system comprising a reception stage that includes an antenna input, the reception stage comprising an amplification device configured to amplify a reception signal, and a signal processor configured to process the amplified reception signal, wherein the amplification device comprises an amplification stage having a transconductance amplification transistor and an output terminal, and a biasing circuit configured to bias, in common mode, the output terminal to a bias potential based on a gate-source voltage present between a gate and a source of the amplification transistor, the gate-source voltage being compensated for parasitic variations, wherein the biasing circuit is configured to pass a compensation current through a first resistor connected between the gate of the amplification transistor and the output terminal, the voltage generated across terminals of the first resistor being intended to compensate the parasitic variations.

12. The system according to claim 11, further comprising an antenna coupled to the antenna input of the reception stage.

13. The system according to claim 12, wherein the radio frequency communication system is part of a personal computer.

14. The system according to claim 12, wherein the radio frequency communication system is part of a mobile telephone.

15. An amplification device comprising: a reference voltage terminal; an output terminal; a transconductance amplification transistor having a current path between the reference voltage terminal and the output terminal; a resistor coupled between a gate of the amplification transistor and the output terminal; and a compensation transistor having a current path coupled between the reference voltage terminal and a node that is connected to both the gate of the amplification transistor and a terminal of the resistor.

16. The device according to claim 15, wherein a gate of the compensation transistor is coupled to a fixed control voltage terminal.

17. The device according to claim 15, further comprising a second resistor coupled between a source of the compensation transistor and the source of the amplification transistor.

18. The device according to claim 17, further comprising a third resistor connected between the reference voltage terminal and the source of the amplification transistor.

19. The device according to claim 15, further comprising a current generator having a current path coupled between a drain of the compensation transistor and ground terminal.

* * * * *